295H

United States Patent
Naseem et al.

(10) Patent No.: US 11,791,168 B2
(45) Date of Patent: *Oct. 17, 2023

(54) METHOD FOR CREATING A WETTABLE SURFACE FOR IMPROVED RELIABILITY IN QFN PACKAGES

(71) Applicant: Texas Instruments Incorporated, Dallas, TX (US)

(72) Inventors: Sadia Naseem, Dallas, TX (US); Vikas Gupta, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 202 days.

This patent is subject to a terminal disclaimer.

(21) Appl. No.: 17/172,043

(22) Filed: Feb. 9, 2021

(65) Prior Publication Data
US 2021/0166951 A1 Jun. 3, 2021

Related U.S. Application Data

(63) Continuation of application No. 16/027,558, filed on Jul. 5, 2018, now Pat. No. 10,916,448.

(51) Int. Cl.
*H01L 23/495* (2006.01)
*H01L 21/48* (2006.01)

(52) U.S. Cl.
CPC .... *H01L 21/4821* (2013.01); *H01L 23/49582* (2013.01)

(58) Field of Classification Search
CPC ......... H01L 23/49582; H01L 23/49888; H01L 23/49575
See application file for complete search history.

(56) References Cited

U.S. PATENT DOCUMENTS

| 8,106,496 | B2* | 1/2012 | Ramakrishna | ...... H01L 21/6835 |
| | | | | 257/784 |
| 10,615,787 | B2* | 4/2020 | Kondo | .................. H03K 17/042 |
| 10,916,448 | B2* | 2/2021 | Naseem | ................ H01L 21/561 |
| 11,348,265 | B1* | 5/2022 | Nielsen | .............. H04N 5/23238 |
| 2004/0036180 | A1* | 2/2004 | Ho | .................... H01L 23/49568 |
| | | | | 257/796 |

(Continued)

*Primary Examiner* — Dale E Page
*Assistant Examiner* — Wilner Jean Baptiste
(74) *Attorney, Agent, or Firm* — Dawn Jos; Frank D. Cimino

(57) ABSTRACT

The disclosed principles provide for implementing low-cost and fast metallic printing processes into the QFN and other no-leads package assembly flow to selectively print solderable material in areas that would otherwise be susceptible to corrosion and thus pose reliability risks. The problem of copper corrosion and poor BLR performance in no-leads packages because of remaining exposed copper areas after package singulation is solved by employing selective metallic printing processes in the assembly flow to coat all risk-prone areas with solder material. For example, for no-leads packages that are formed using printed leadframes, solder can be deposited through inkjet, screen, stencil, or photonic printing into the grooves which are formed after passivating the packages at the strip level. The singulating occurs through the grooves having solder printed therein, and results in wettable upper and sidewall surfaces of the outer ends of the leadframe for each package.

18 Claims, 7 Drawing Sheets

(56) References Cited

U.S. PATENT DOCUMENTS

2014/0175599 A1   6/2014  Romig et al.
2016/0190095 A1*  6/2016  Celaya .............. H01L 23/49548
                                                        438/111
2017/0033072 A1*  2/2017  Cook ....................... H01L 24/27

* cited by examiner

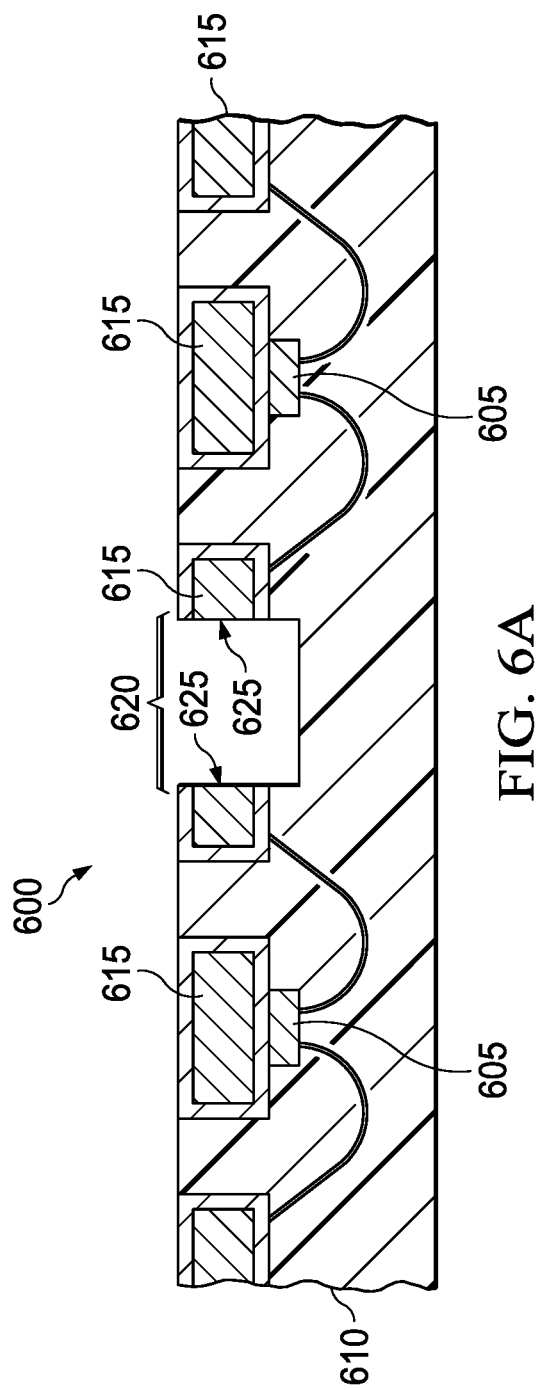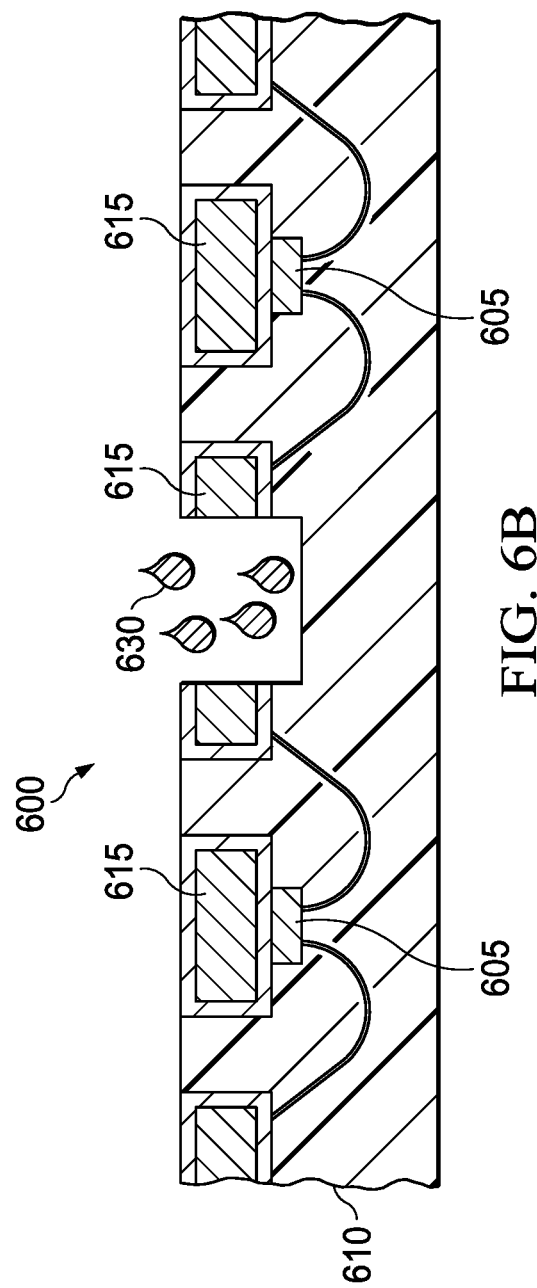

METHOD FOR CREATING A WETTABLE SURFACE FOR IMPROVED RELIABILITY IN QFN PACKAGES

This application is a continuation of U.S. patent application Ser. No. 16/027,558, filed Jul. 5, 2018, the contents of which are herein incorporated by reference in its entirety.

TECHNICAL FIELD

The present disclosure relates to QFN package manufacturing techniques, and more particularly relates to a technique for creating a wettable surface for improved reliability in QFN packages.

BACKGROUND

Flat no-leads packages, such as quad-flat no-leads (QFN) packages, are a surface-mount package technology that connect integrated circuits (ICs) to surfaces of printed circuit boards (PCBs) without the use of through-holes to provide the electrical connections between the PCB and the package. A flat no-lead package refers to an encapsulated IC package made with a planar copper leadframe strip. The silicon IC die within a QFN package is electrically connected to the lead frame by wires, and this structure is encapsulated in a dielectric material such as plastic. A thermal pad is also typically included in the QFN package to assist in transferring heat.

Perimeter lands on the package bottom provide electrical connections from the copper lead frame to the PCB once the package is mounted on the PCB. These lands are end portions of the copper lead frame that remain exposed once the package is encapsulated. To mechanically and electrically mount QFN packages to a PCB, the exposed lands are electrically connected to contact pads on the PCB. Typically, this connection is provided by soldering QFN package lands to corresponding contact pads. Since the soldered connection between the QFN package lands and the PCB contact pads provide both the physical and electrical connections between the two, the Board Level Reliability (BLR), which is the quality and reliability of solder connections after mounting a package to a PCB, must be sufficiently high. For example, the typical thermal cycling condition required for adequate BLR is from −40° C. to +125° C. This is to ensure reliable package performance under extreme operating conditions.

One of the reliability issues that plagues QFN packages containing either printed leadframes or even traditional leadframes, is the solderability issues with exposed leadframes after the packages are singulated. More specifically, the exposed leadframes, which are the exposed edges of the leadframes used to connect singulated QFN packages to PCBs, typically have a non-wetting solderability issue due to oxidation of the exposed copper surfaces of the leadframe edges after package singulation. The exposed copper oxidizes and thus cannot be wetted by solder materials, and the wetting of the mounting edges or pads of the leadframes is directly related to BLR performance. Without proper wetting, the integrity of the soldered leadframe mounting pad to a PCB can mechanically, and thus electrically, breakdown during package use.

Accordingly, what is needed in the art is a technique for producing no-leads packages that have no exposed copper even after singulation of each package, and that does not suffer from the deficiencies of the prior art. The disclosed principles provides these techniques and other improvements.

SUMMARY

The disclosed principles provide for implementing low-cost and fast metallic printing processes into the QFN and other no-leads package assembly flow to selectively print solderable material in areas that would otherwise be susceptible to corrosion and thus pose reliability risks. The problem of copper corrosion and poor BLR performance in no-leads packages because of remaining exposed copper areas after package singulation is solved by employing selective metallic printing processes in the assembly flow to coat all risk-prone areas with solder material.

For example, for no-leads packages that are formed using printed leadframes, solder can be deposited through inkjet, screen, stencil, or photonic printing into the grooves which are formed after passivating the packages at the strip level. The singulating occurs through the grooves having solder printed therein, and results in wettable (solder covered) upper and sidewall surfaces of the outer ends of the leadframes for each package.

In one embodiment, such a method of creating a wettable surface on mounting pads of leadframes in no-leads packages may include providing a leadframe on an unsingulated strip, where the leadframe provides electrical interconnection for no-leads packages formed from the strip. Such a method may then include depositing a passivation layer over the leadframe of the unsingulated strip, the passivation layer having openings exposing outer ends of the leadframe. Then, the exemplary method may include depositing a solder material into the openings in the passivation layer to a height of the passivation layer, where the solder material is covering the exposed outer ends of the leadframe. Such a method may also include singulating the strip between the outer ends of the leadframe by cutting through the deposited solder material. After this singulation, the solder material on the covered outer ends of the leadframe provides mounting pads for the no-leads packages formed from the singulated strip, where the mounting pads have a wettable surface on both upper and side surfaces of the covered outer ends.

An alternative solution for no-leads packages having printed leadframes is that all exposed copper at what will be the outer ends of all the leadframes can be coated with printed solder during package formation to prevent there from being any exposed copper on the outside of the package. For example, a layer of copper may be printed to create the leadframe for a package. However, the outer ends of the leadframe, which will serve as the mounting pads for each package after singulation, are printed to at least their final thickness in copper. Then, in a second printing step with solder instead of copper, the remaining thickness of the outer ends of the leadframes is printed to its originally intended final thickness for the leadframe ends. Thus, a portion of the thickness of the leadframes at their outer edges (i.e., the mounting pads) is comprised of part copper and part printed solder rather than being all printed copper. In a more specific embodiments, the thickness of the leadframes at their outer edges is comprised of about half copper and about half printed solder, although other thickness proportions are also possible.

One embodiment of such a method for creating a wettable surface on mounting pads of leadframes in no-leads packages may include forming a plurality of unsingulated no-leads packages on a strip by forming a leadframe for electrical interconnection for such packages. In doing so, the leadframe is formed with outer ends providing a first thickness. The exemplary method may further include depositing a passivation layer over each of the leadframe of each no-leads package, where the passivation layer has openings exposing the outer ends of the leadframes. In addition, the method may then include depositing a solder material on the outer ends of the leadframes through the openings, where the deposited solder material is providing a second thickness. In these embodiments, the deposited solder material on the outer ends of the leadframes provide mounting pads for the no-leads packages having a wettable surface on both upper and side surfaces of the mounting pads.

For other no-leads packages having a leadframe formed with a copper deposition technique, plating conductive materials, such as tin or other metals, is used in a post-singulation process to coat exposed regions of copper from the singulated portions of a leadframe. A solution in accordance with the disclosed principles eliminates such a post-plating process, and instead again uses a printing process to print solder over exposed copper areas. For example, one embodiment of such a method of creating a wettable surface on mounting pads of the leadframe structure in such no-leads packages includes providing a leadframe on an unsingulated strip, where the leadframe provides for electrical interconnection of the no-leads packages formed from the strip. The method may then include singulating through only an initial portion of the strip between to create exposed sidewalls of outer ends of singulated portions of the leadframe. This exemplary method may also include depositing a solder material onto the exposed sidewalls of the singulated portions of the leadframe to cover the outer ends of the singulated portions, and then singulating through the remaining portion of the strip between the now-covered outer ends of the singulated portions of the leadframe. In this exemplary method, the solder material covers the outer ends of the singulated leadframe to provide mounting pads having a wettable surface for the singulated no-leads packages.

In yet another aspect, the disclosed principles provide a no-leads package. In one embodiment, the no-leads package may comprise a leadframe, and a passivation layer over the leadframe, where the passivation layer has openings exposing outer ends of the leadframe. The exemplary no-leads package may also comprise an ink residue including solder covering the exposed outer ends of the leadframe providing mounting pads for the no-leads package having a wettable surface on both upper and side surfaces of the covered outer ends.

BRIEF DESCRIPTION OF THE DRAWINGS

The novel features believed characteristic of the disclosure are set forth in the appended claims. The invention itself, however, as well as a preferred mode of use, further objectives and advantages thereof, will be best understood by reference to the following detailed description of illustrative embodiments when read in conjunction with the accompanying drawings, wherein:

FIGS. 6A-6D illustrate a series of block diagrams showing one embodiment of a method in accordance with the disclosed principles of creating a wettable surface on the mounting pads of no-leads packages where the leadframes are formed using copper deposition techniques.

DETAILED DESCRIPTION

The various embodiments of the presently disclosed subject matter are described with specificity to meet statutory requirements. However, the description itself is not intended to limit the scope of this patent. Rather, it has been contemplated that the claimed subject matter might also be embodied in other ways, to include different steps or elements similar to the ones described in this document, in conjunction with other present or future technologies. The components described hereinafter as making up various elements of the invention are intended to be illustrative and not restrictive. Many suitable components that would perform the same or similar functions as the components described herein are intended to be embraced within the scope of the invention. Such other components not described herein can include, but are not limited to, for example, similar components that are developed after development of the presently disclosed subject matter.

It should also be noted that, as used in the specification and the appended claims, the singular forms "a," "an" and "the" include plural references unless the context clearly dictates otherwise. References to a composition containing "a" constituent is intended to include other constituents in addition to the one named. Also, in describing the preferred embodiments, terminology will be resorted to for the sake of clarity. It is intended that each term contemplates its broadest meaning as understood by those skilled in the art and includes all technical equivalents which operate in a similar manner to accomplish a similar purpose.

Also, the use of terms herein such as "having," "has," "including," or "includes" are open-ended and are intended to have the same meaning as terms such as "comprising" or "comprises" and not preclude the presence of other structure, material, or acts. Similarly, though the use of terms such as "can" or "may" is intended to be open-ended and to reflect that structure, material, or acts are not necessary, the failure to use such terms is not intended to reflect that structure, material, or acts are essential. To the extent that structure, material, or acts are presently considered to be essential, they are identified as such.

It is also to be understood that the mention of one or more method steps does not preclude the presence of additional method steps or intervening method steps between those steps expressly identified. Moreover, although the term "step" may be used herein to connote different aspects of methods employed, the term should not be interpreted as implying any particular order among or between various steps herein disclosed unless and except when the order of individual steps is explicitly required.

Figure 1:
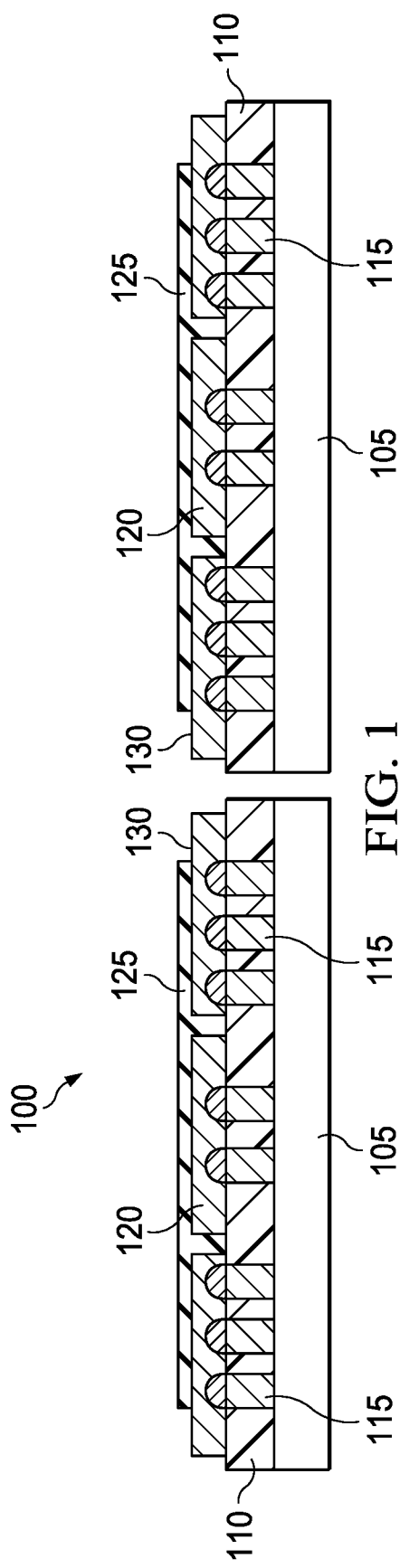
FIG. 1 illustrates is cross-sectional view of a no-leads package having a printed leadframe.

Turning initially to FIG. 1, illustrated is a cross-sectional view of a no-leads package 100 having printed leadframes. The package 100 is comprised of an IC die 105 encapsulated with a dielectric mold compound 110. To electrically connect the underlying IC die 105, conductive vias or pillars 115 are formed through the mold compound 110 to contact the IC die 105, and protrude above the mold compound 110 to contact leadframes 120. The leadframes 120 are formed by printing copper on the mold compound 110 and in electrical contact with the conductive vias 115, for example, via tin caps formed at the upper ends of the conductive vias 115. It should be noted that the vias 115 may also be embodied as conductive pillars, solder bumps, and other types of interconnect structures, and no limitation to any particular structure is intended or should be implied.

A passivation layer 125 is formed over the leadframes 120 to form a dielectric barrier for the leadframes 120. In many manufacturing techniques, the passivation layer 125 is also printed on the package 100. When the passivation layer 125 is formed on the leadframes 120, outer ends of select leadframes are left exposed. These exposed outer ends 130 are the portions of the leadframes 120 that soldered to a PCB to mount the package 100 onto that PCB. After manufacturing, the no-leads package 100 is singulated where the exposed outer ends 130 of the leadframes 120 are located. This singulation results in the exposed outer ends 130 forming the mounting pads of each singulated package 100, with an upper and side surface of the exposed outer ends 130 providing the surfaces to be soldered during package 100 mounting. However, the upper and side surfaces of the exposed outer ends 130 comprise exposed copper, which then may oxidize as each singulated package 100 awaits mounting on a PCB and can result in the problems mentioned above.

One solution for the exposed upper and side surfaces of these outer ends 130 is to create a wettable flank having one or more wettable surface(s) on the outer ends 130 using a material that covers the exposed outer ends and helps increase the integrity of the solder joint between the wettable flank and bonding pads of a circuit board. The degree of wetting (i.e., the wettability of a wettable surface) is determined by a force balance between adhesive and cohesive forces, and is important in the bonding or adherence of two materials. For example, solder is deposited on a portion of the outer ends 130 to create the wettable flank. Unfortunately, the wettable flank may not cover all of the exposed copper of the outer ends 130, and thus portions of the outer ends 130 may still oxidize and thus affect the integrity of the soldered package 130. This is because the solder may does not adequately cover all of the exposed copper on the outer ends 130. Alternatively, the solder material can be deposited over the exposed outer ends 130 prior to singulating each package 100. However, this technique still results in sidewalls of the outer ends 130 having exposed copper once each package 100 is singulated from a strip.

Figure 2:
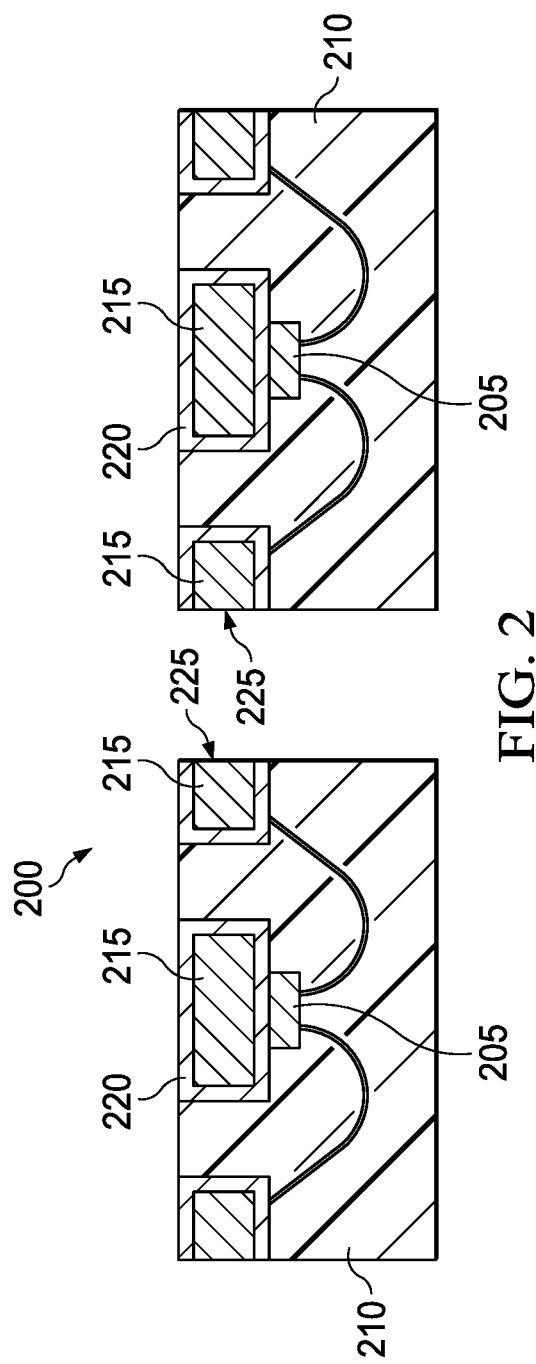
FIG. 2 illustrates a cross-sectional view of a no-leads package having a deposited leadframe.

Looking now at FIG. 2, illustrated is a cross-sectional view of another no-leads package 200 having a leadframe. This embodiment of a no-leads package 200 still includes an IC die 205 encapsulated with a dielectric mold compound 210. However, this embodiment of a no-leads package 200 has a leadframe 215 formed no using a printing technique. The leadframe 215 is again formed of copper, for example using any desired copper deposition technique.

Formed around each cross-sectional view of the leadframe 215 is a metal plating 220. For example, NiPdAu alloy may be used to create the plating 220 around the copper leadframe 215. Once the circuitry, i.e., the wire bonded interconnects from each die 205 to the leadframe 215 structure, for each package 200 is formed, the no-leads packages 200 are singulated from a strip. The singulation occurs by cutting through leadframe 215, which exposes copper on the sidewalls 225 of each singulated package 200. These exposed sidewalls 225 serve as the mounting pads for soldering the singulated packages 200 to a PCB. However, as before, the exposed sidewalls 225 are comprised of copper, which again oxidizes as each singulated package 200 awaits mounting on a PCB and can still result in the problems mentioned above. One solution is to employ a post-mold plating process to plate exposed copper. However, this plating solution is expensive and still produces exposed copper after singulation because individual units must be connected during the plating process for the plating current to be active on the exposed surfaces for electrolytic plating.

Figure 3A:
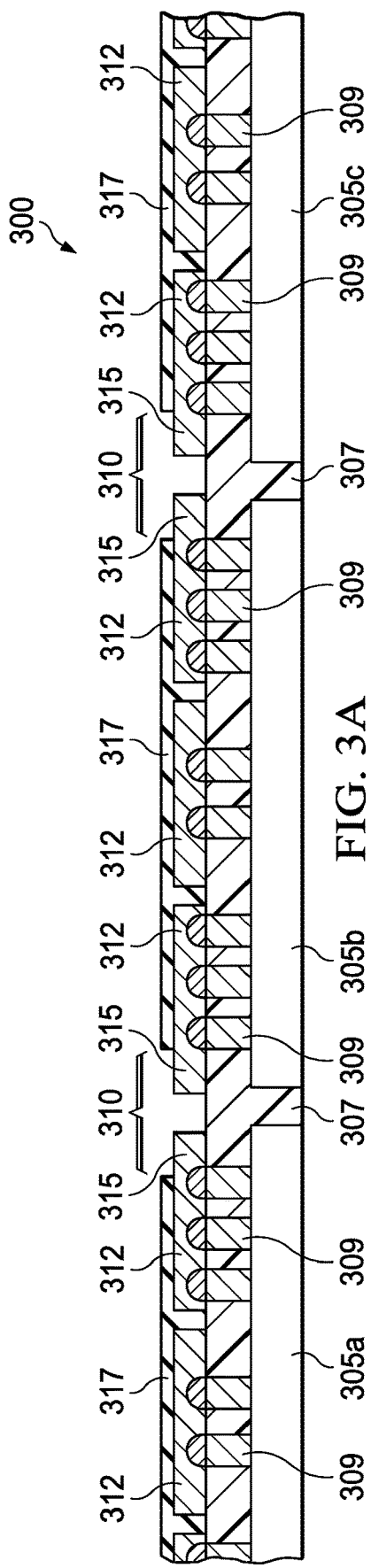
FIGS. 3A-3D illustrate a series of block diagrams showing one embodiment of a method of creating a wettable surface on the mounting pads of leadframes in no-leads packages, in accordance with the disclosed principles.

Looking now at FIGS. 3A-3D, illustrated is a series of block diagrams showing one embodiment of a method of creating a wettable surface on the mounting pads of leadframes in no-leads packages, in accordance with the disclosed principles. FIG. 3A illustrates a cross-sectional view of a molded leadframe strip 300 from which a plurality of no-leads packages will be formed. The strip 300 includes IC dies 305a, 305b, 305c encapsulated in mold compound 307, and each die 305a, 305b, 305c is electrically connected to a leadframe 312 using one or more conductive pillars 309. The strip 300 includes openings 310 exposing outer ends 315 of a the leadframe 312, which in turn provides electrical interconnection to and through each no-leads package formed from the strip 300. Specifically, a passivation layer 317 is deposited over the leadframe 312 of the strip 300, which may be done using advantageous deposition techniques. In advantageous embodiments, the leadframe 312 is printed using any of a variety of available printing processes. Additionally, the passivation layer 317 may also be printed using any such printing process. As discussed above, the exposed outer ends 315 of the leadframe 312, which are typically composed of copper, will oxidize through exposure via the openings 310 in the passivation layer 317.

Figure 3B:
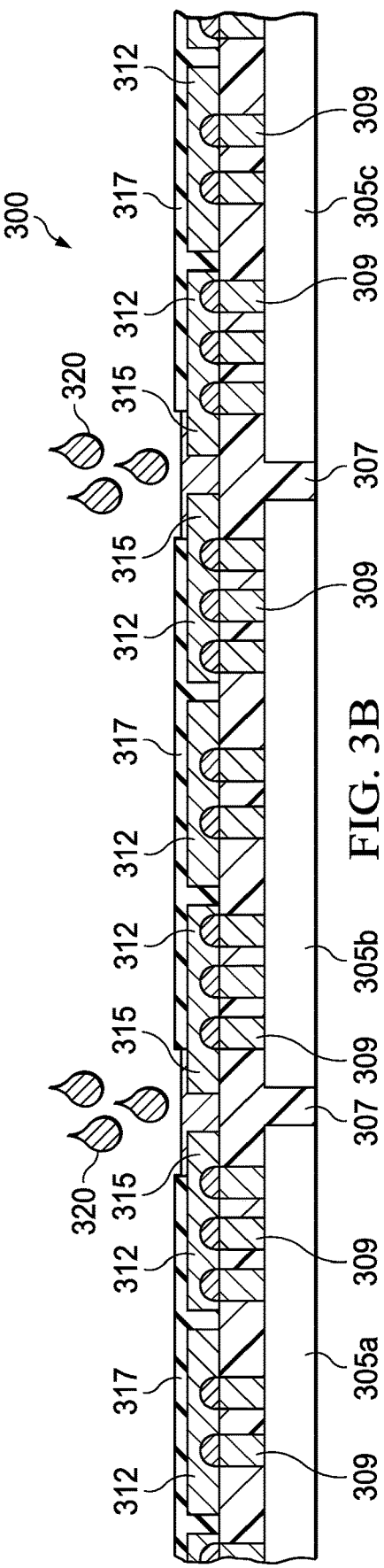

Turning to FIG. 3B, illustrated is a cross-sectional view of the strip 300 at a later stage of a disclosed example process. At this stage in the process, solder 320 is deposited into the openings 310 between the passivation layer 317. More specifically, the solder 320 is deposited to completely cover the exposed outer ends 315 of the leadframe 312. By covering the previously exposed outer ends 315 of the leadframe 312, the copper comprising the outer ends 315 will not oxide as the packages, once singulated from the strip 300, sit before mounting to a PCB. Exemplary materials for the solder 320 include silver, tin, alloys thereof or any other material suitable for use as a solderable material. In preferred embodiments, the solder 320 is a printable tin ink; however, other printable metallic inks, such as gold, silver, tin alloys, or combinations thereof, may also be employed.

In one exemplary embodiment, the solder 320 is deposited using a printing process, for example, an inkjet, screen, stencil or photonic printing process. Of course, other printing processes, either now existing or later developed, may also be employed to deposit the solder 320 over the outer ends 315 of the leadframe 312. Moreover, in advantageous embodiments, the solder 320 is printed or otherwise deposited to a height of the passivation layer 317. As such, the solder 320 is used to fill the openings 310 between the passivation layer 317, thereby completely covering the outer ends 315 of the leadframe 312. In preferred embodiments, the solder 320 is deposited to at least a thickness of about 7 microns; however, other thicknesses may also be deposited. In addition, in some embodiments, exemplary processes further include sintering the deposited solder 320 prior to singulating the strip 300. Such sintering may be performed at temperatures ranging from about 120° C.-250° C., but other temperatures may also be employed.

Figure 3C:
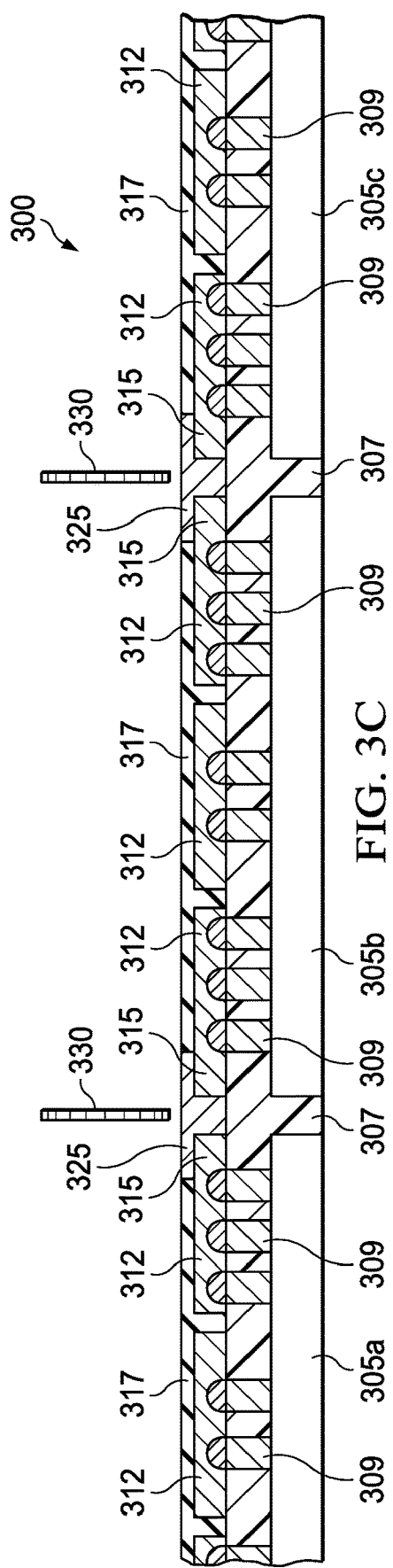

In FIG. 3C, illustrated is a cross-sectional view of the strip 300 having the packages 305a, 305b, 305c at a further stage of the disclosed exemplary process. In particular, the strip 300 having the solder 320 filling the openings 310 undergoes a singulation process. In the singulation process, saws 330 or other cutting devices are employed to singulate the strip 300 to form each of the no-leads packages. The singulation occurs between the outer ends 315 of the leadframe 312 by cutting through the deposited solder 320. It should be noted that the spacing between the outer ends 315 of the leadframe 312 is larger than a width of the saw or other cutting device used to singulate the strip 300.

Figure 3D:
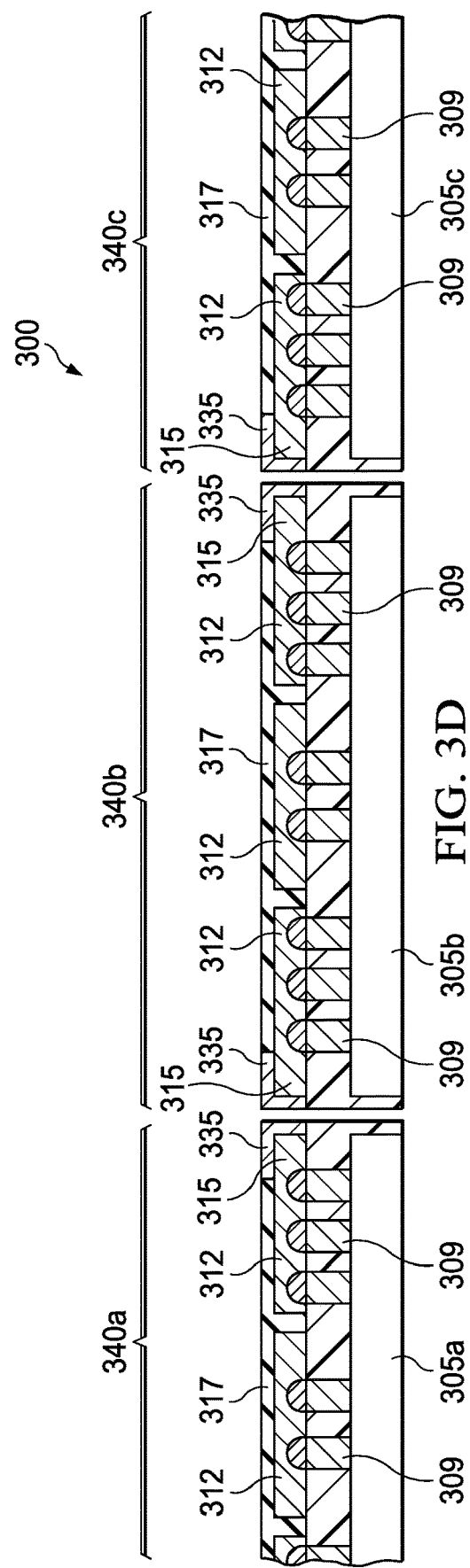

Looking now at FIG. 3D, illustrated is a cross-sectional view of the no-leads packages 340a, 340b, 340c after singulation of the strip 300. As such, after singulation the solder 320 on the outer ends 315 of the leadframe 312 provides mounting pads 335 for the no-leads packages 340a, 340b, 340c. With the solder 320 on and between the outer ends 315, the resulting mounting pads 335 have a wettable surface on both upper and side surfaces of the outer ends 315 of the leadframe for each package 340a, 340b, 340c. Thus, as the packages 340a, 340b, 340c are awaiting mounting to respective PCBs, the outer ends 315 are no longer exposed since they are covered by the solder 320 on all exposed sides forming the mounting pads 335.

Figure 4:
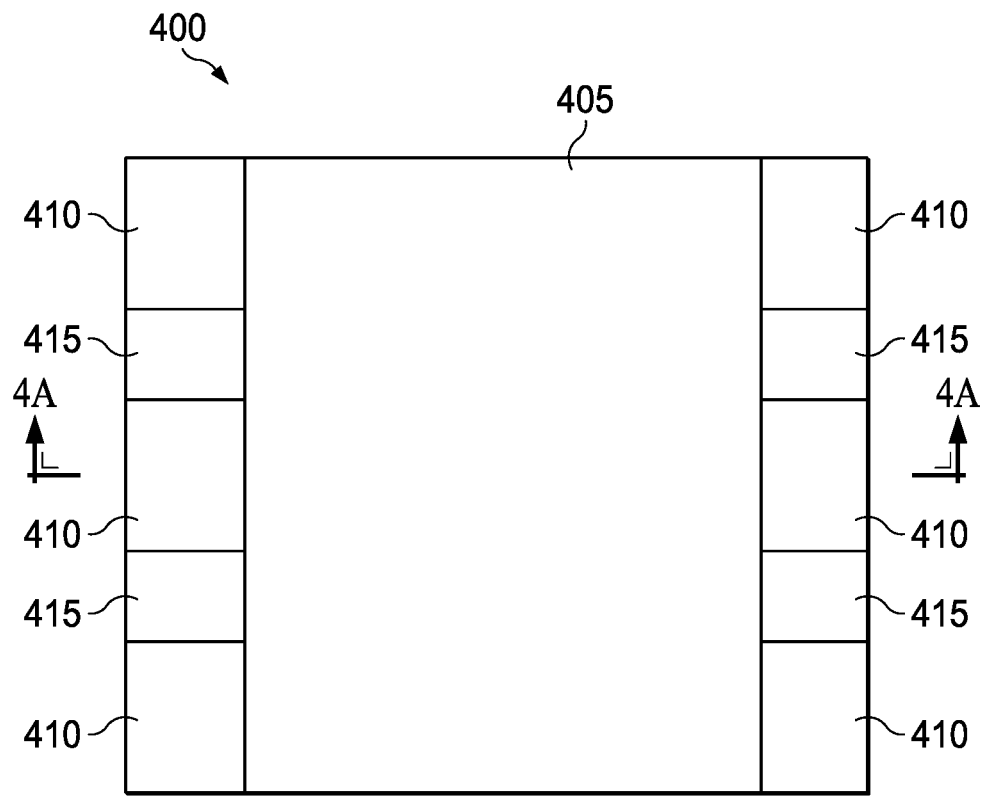
FIG. 4 illustrates a block diagram of a bottom view of a no-leads package having printed copper used to build up the outer ends of the leadframe for use as mounting pads for the package.

Turning now to FIG. 4, illustrated is a block diagram of a bottom view of a no-leads package 400 having printed copper used to build up the outer ends of the leadframe for use as mounting pads for the package 400. The package 400 includes a passivation layer 405 covering and thus dielectrically protecting most of the leadframe and other components of the package 400. Along outer edges of the package 400 are mounting pads 410 separated by either the passivation layer 405 or dielectric mold compound 415 encapsulating the circuitry within the package 400.

Figure 4A:
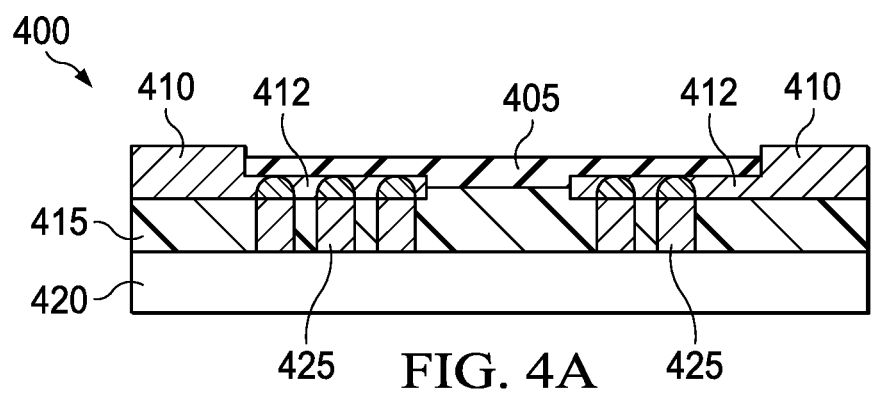
FIG. 4A illustrates a cross-sectional view taken along line A-A of the no-leads package of FIG. 4.

FIG. 4A illustrates a cross-sectional view taken along line A-A of the no-leads package 400 of FIG. 4. This view of the package 400 shows the underlying IC die 420 encapsulated by the mold compound 415. Also shown are conductive pillars 425 electrically connecting the underlying IC die 420 to the leadframe 412 formed closer to the outer surface of the package 400. In addition to the leadframe 412 being printed, typically using copper, outer ends of the leadframe 412 are printed to a greater thickness above the passivation layer 405 to form copper mounting pads 410 for use in mounting and electrically connecting the package 400 to a PCB. However, as discussed above with regard to other no-leads packages, the printed copper mounting pads 410 comprise a completely exposed upper surface which will oxidize as the package 400 is awaiting mounting to a PCB.

Figure 5:
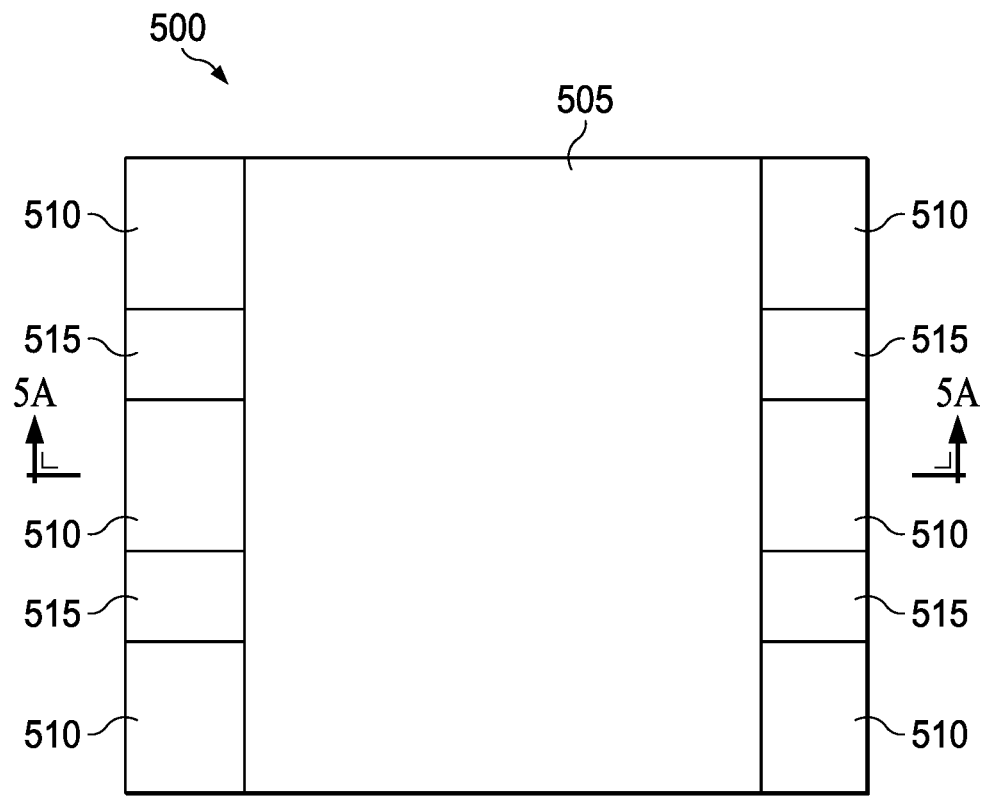
FIG. 5 illustrates a block diagram of a bottom view of a no-leads package having printed copper used to create the leadframe and a solder material used to form mounting pads for the package, in accordance with the disclosed principles.

Turning now to FIG. 5, illustrated is a block diagram of a bottom view of a no-leads package 500 having printed copper used to create the leadframe, but further having a solder material to form mounting pads for the package 500. More specifically, the package 500 again includes a passivation layer 505 covering and dielectrically protecting most of the leadframe and other components of the package 500. However, along outer edges of the package 500 are mounting pads 510 formed in accordance with the disclosed principles using a solder material. These mounting pads 510 are again separated by either the passivation layer 505 or dielectric mold compound 515 encapsulating the circuitry within the package 500.

Figure 5A:
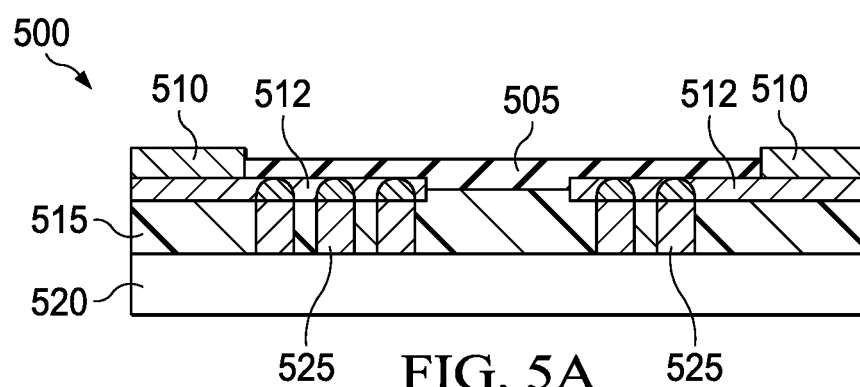
FIG. 5A illustrates a cross-sectional view taken along line B-B of the no-leads package 500 of FIG. 5.

FIG. 5A illustrates a cross-sectional view taken along line B-B of the no-leads package 500 of FIG. 5. This view of the package 500 again shows the underlying IC die 520 encapsulated by the mold compound 515. In exemplary embodiments, the leadframe 512 is printed, typically using copper, as discussed above. However, in accordance with the disclosed principles, the outer ends of the leadframe 512 are not printed to a greater thickness above the passivation layer 505 using copper, as is found in other packages.

Instead, another embodiment of the disclosed principles includes printing on the outer ends of the leadframe 512 with solder to form the mounting pads 510. As shown, the mounting pads 510 may be printed to a height extending above the passivation layer 505 so that the mounting pads 510 may be used in mounting and electrically connecting the package 500 to a PCB. By forming the mounting pads 510 by printing solder, which again may be by inkjet, screen, stencil and photonic printing, the outer ends of the copper leadframe 512 are covered so as to prevent their oxidation. In preferred embodiments, the solder is comprised of a printed silver ink; however, other types of metals that may be used as a solderable material maybe employed. In addition, in some embodiments, after printing the mounting pads 510 exemplary embodiments of the disclosed process may again include sintering, again at temperatures ranging from about at 120° C.-250° C., the deposited solder material.

In yet another embodiment, the outer ends of the leadframe 512 are printed with copper to a lesser thickness than their designed final thickness. Then a process in accordance with the disclosed principles may be employed to finish printing the remaining thickness of the outer ends of the leadframe 512 with solder. In such embodiments, the outer ends of the leadframe 512 would have a step-down in thickness compared to the other portions of the leadframe 512, with the printed solder providing the remainder of the originally intended thickness of the outer ends, as well as providing mounting pads 510 having a wettable upper and side surface.

In either of these embodiments, the printed mounting pads 510 provide both upper and sidewall wettable surfaces to be used to solder the package 500 to a PCB. More specifically, although some sidewall surface of the ends of the leadframe 512 may still be exposed in these embodiments, those exposed copper surfaces would be used for soldering the package 500 to a PCB. Instead, only the upper and sidewall surfaces of the mounting pads 510 printed on the outer ends of the leadframe 512 would provide the wettable surfaces used to solder the package 510 to a PCB. As such, a wettable surface is provided on both the upper and sidewall surfaces used to mount the package 510.

Referring now to FIGS. 6A-6D, illustrated is a series of block diagrams showing one embodiment of a method in accordance with the disclosed principles of creating a wettable surface on the mounting pads of no-leads packages where the leadframe for each package is not formed using a printing technique. In particular, rather than the leadframes being printed as found in embodiments discussed above, the leadframes in this exemplary process are formed using copper deposition techniques. For example, a copper sputtering or other deposition technique for forming the leadframes may be used.

FIG. 6A illustrates a cross-sectional view of a strip 600 having a plurality of IC dies 605 encapsulated in mold compound 610. Included with the IC dies 605 is a leadframe 615 throughout the strip 600 and which is formed of copper, for providing electrical connection to the IC dies 605. In this embodiment of a disclosed process, a step-cut is performed to singulate through an initial portion of the strip 600, as well as a portion of the leadframe 615 located between what will be the individual packages. This step-cut made through the intervening leadframe 615 creates openings 620 through which outer ends 625 of the singulated portions of the leadframe 615 are now exposed. As before, by being exposed the outer ends 625 of the copper leadframe 615 will oxidize prior to their use in mounting the packages to respective PCBs.

FIG. 6B illustrates a cross-sectional view of the strip 600 during a later stage of this exemplary process of creating a wettable surface on the mounting pads of the eventual packages. At this stage, solder 630 is deposited into the opening 620. More specifically, the solder 630 is deposited so as to ensure coverage of the sidewalls of the opening 620 to completely cover the exposed outer ends 625 of the singulated portions of the leadframe 615. As before, by covering the previously exposed outer ends 625 of the leadframe 615, the copper comprising the outer ends 625 will not oxide as the packages await mounting to a PCB. Exemplary materials for the solder 630 may again include silver, tin, alloys thereof or any other material suitable for use as a solderable material. Also, in preferred embodiments, the solder 630 is a printable tin ink; however, other printable metallic inks may also be employed. Moreover, the solder 630 may be deposited using a printing process, for example, an inkjet, screen, stencil or photonic printing process. Of course, other printing processes, either now existing or later developed, may also be employed to deposit the solder 630 over the outer ends 625 of the singulated portions of the leadframe 615. Notably, in this embodiment of the disclosed principles, the solder 630 is not required to completely fill the openings 620 between packages, and instead is only deposited so as to ensure coverage of any of the exposed copper on the outer ends 625. For example, the solder 630 may be deposited to at least a thickness of about 7 microns; however, other thicknesses may also be deposited. In addition, exemplary processes may again include sintering the deposited solder 630 after deposition, as discussed above and prior to singulation. Alternatively, the solder 630 may be printed so as to completely fill the opening 620, if desired.

Figure 6C:
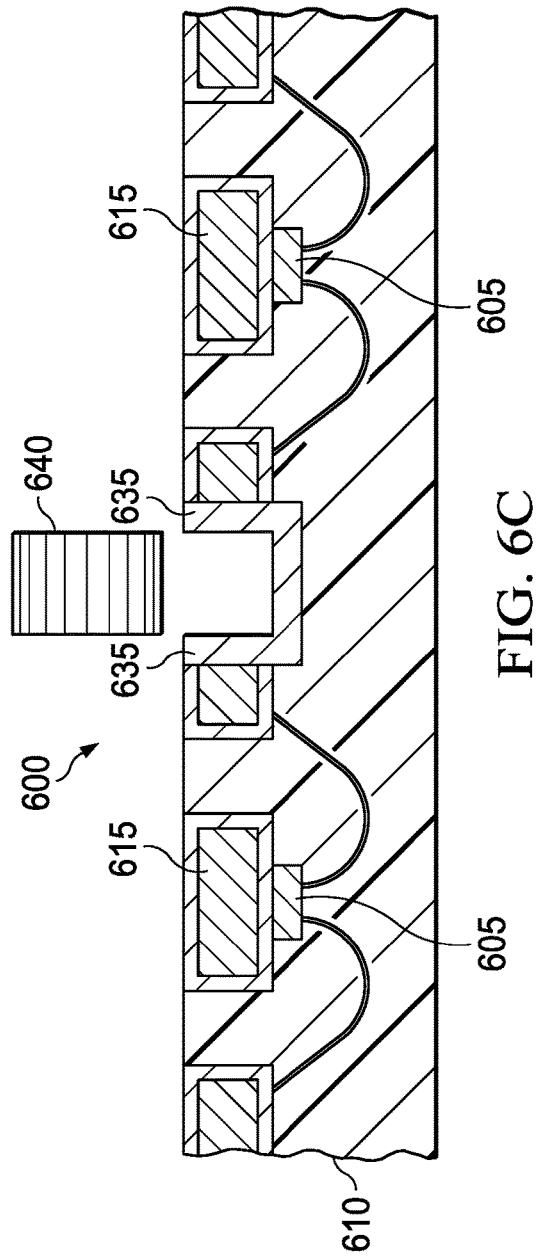

FIG. 6C illustrates a cross-sectional view of the strip 600 at a further stage of the disclosed exemplary process. In particular, the strip 600 having the solder 630 placed on the sidewalls of the openings 620 forms the mounting pads 635 for the eventual packages. In order to singulate the packages, saws 640 or other cutting devices are employed to singulate each of the packages from one another. The singulation occurs between the mounting pads 635 formed by the solder 630 on the outer ends 625 of the leadframe 615 structure by singulating through a remaining portion of the mold compound 610 and other portions of the strip 600 between the covered outer ends 625. In this embodiment, the spacing between the sidewall mounting pads 635 on the outer ends 625 may be equal to or smaller than a width of the saw 640 or other cutting device used to singulate the strip 600 such that a smooth vertical surface comprising the mounting pads 635 and inner surfaces of the molding compound 610 is formed during singulation, as shown in FIG. 6D.

Figure 6D:
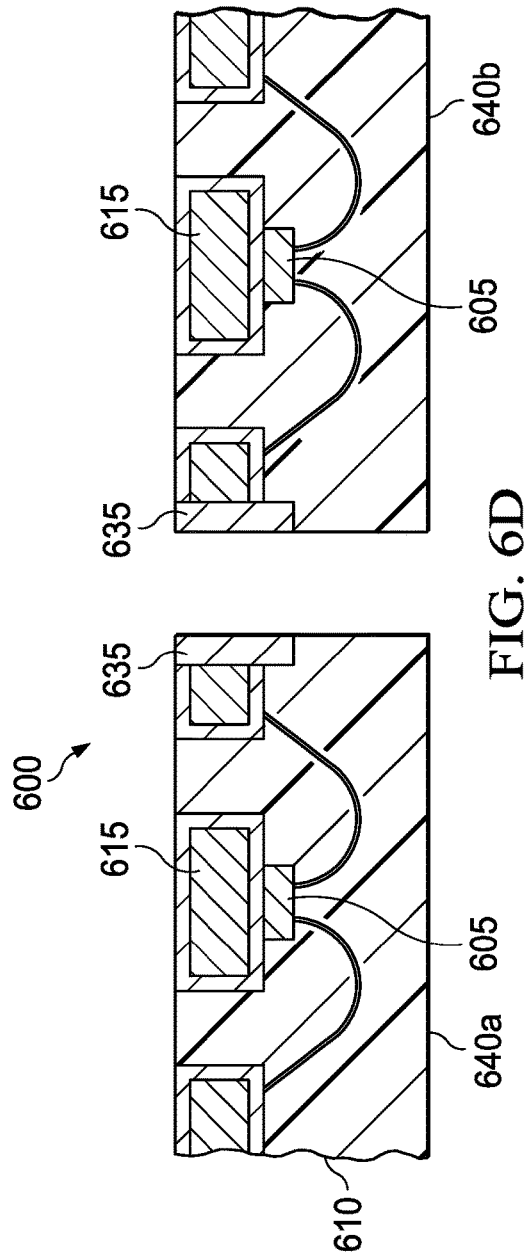

Looking now at FIG. 6D, illustrated is a cross-sectional view of the strip 600 once the packages 640a, 640b have been singulated from one another. As such, after singulation the solder 630 on the outer ends 625 of the singulated portions of the leadframe 615 provide the mounting pads 635 for the no-leads packages 640a, 640b. With the solder 630 completely covering the sidewalls at the outer ends 625, the resulting mounting pads 635 have a wettable surface on the outer ends 625 for connection to the PCB. Thus, as the packages 640a, 640b are awaiting mounting to respective PCBs, the outer ends 625 are no longer exposed since they are covered by the solder 630 on the previously exposed surfaces to form the mounting pads 635.

In sum, the disclosed principles provide various methods for implementing low-cost and fast metallic printing processes into the QFN and other no-leads package assembly flow to selectively print solderable material in areas that would otherwise be susceptible to corrosion and thus pose reliability risks. The problem of copper corrosion and poor BLR performance in no-leads packages because of remaining exposed copper areas after package singulation is solved by employing selective metallic printing processes in the assembly flow to coat all risk-prone areas with solder material. The process of printing solder material in any of the techniques disclosed herein is relatively low in cost and faster than plating processes currently used in the industry, and thus eliminates the need of lengthy regulated plating lines and replaces the post-plating equipment associated with plating processes. The disclosed solder printing methods address the issue of non-wetting solderability with the exposed copper surface on both printed copper leadframes and on traditionally produced leadframes. For example, no-leads packages containing printed copper leadframes having exposed copper surfaces on the outer ends of the leadframes will thus have wettable surfaces on those previously exposed and vulnerable surfaces. The wettable surfaces provided as disclosed herein are provided on each surface used to mount packages on a PCB, which thereby increases BLR performance. Moreover, for packages having printed leadframes, the previously employed post-mold plating process may be eliminated, which is typically both a costly and time consuming process. And for packages with traditionally formed leadframes, the need for plating exposed sidewalls of the outer ends of leadframes typically performed after a step-cut is also eliminated with a simpler, faster printing solution.

While this invention has been particularly shown and described with reference to preferred embodiments, it will be understood by those skilled in the art that various changes in form and detail may be made therein without departing from the spirit and scope of the invention. The inventors expect skilled artisans to employ such variations as appropriate, and the inventors intend the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

While various embodiments in accordance with the principles disclosed herein have been described above, it should be understood that they have been presented by way of example only, and not limitation. Thus, the breadth and scope of this disclosure should not be limited by any of the above-described exemplary embodiments, but should be defined only in accordance with any claims and their equivalents issuing from this disclosure. Furthermore, the above advantages and features are provided in described embodiments, but shall not limit the application of such issued claims to processes and structures accomplishing any or all of the above advantages.

Additionally, the section headings herein are provided for consistency with the suggestions under 37 C.F.R. 1.77 or otherwise to provide organizational cues. These headings shall not limit or characterize the invention(s) set out in any claims that may issue from this disclosure. Specifically, and by way of example, although the headings refer to a "Technical Field," the claims should not be limited by the language chosen under this heading to describe the so-called field. Further, a description of a technology as background information is not to be construed as an admission that certain technology is prior art to any embodiment(s) in this disclosure. Neither is the "Brief Summary of the Invention" to be considered as a characterization of the embodiment(s) set forth in issued claims. Furthermore, any reference in this disclosure to "invention" in the singular should not be used to argue that there is only a single point of novelty in this disclosure. Multiple embodiments may be set forth according to the limitations of the multiple claims issuing from this disclosure, and such claims accordingly define the embodiment(s), and their equivalents, that are protected thereby. In all instances, the scope of such claims shall be considered on their own merits in light of this disclosure, but should not be constrained by the headings set forth herein.

What is claimed is:

1. A semiconductor package, comprising:
   a semiconductor die electrically connected to a portion of a leadframe;
   mold compound contacting portions of the semiconductor die, and the portion of the leadframe; and
   an ink residue including solder covering exposed outer ends of the portion of the leadframe providing mounting pads for the semiconductor package having a wettable surface on side surfaces of the covered outer ends.

2. The semiconductor package according to claim 1, wherein the ink residue is deposited using a printing process selected from the group consisting of inkjet, screen, stencil and photonic printing.

3. The semiconductor package according to claim 1, wherein the ink residue comprises silver.

4. The semiconductor package according to claim 1, wherein a first surface of the ink residue is coplanar with a surface of the mold compound.

5. The semiconductor package according to claim 1, wherein a second surface of the ink residue is coplanar with a surface of the portion of the leadframe.

6. The semiconductor package according to claim 1, wherein the ink residue is deposited to a thickness of at least 7 microns.

7. The semiconductor package according to claim 1, wherein the portion of the leadframe is a printed copper leadframe.

8. The semiconductor package according to claim 1, wherein a height of the ink residue is more than a thickness of the portion of the lead frame from a cross sectional view of the semiconductor package.

9. The semiconductor package according to claim 1, wherein the semiconductor package is a quad flat no leads (QFN) package.

10. The semiconductor package according to claim 1, wherein the ink residue includes a rectangular shape from a cross sectional view of the semiconductor package.

11. The semiconductor package according to claim 1, wherein the ink residue provides the wettable surface on portions of the side surfaces of the covered outer ends.

12. A semiconductor package, comprising:
    a semiconductor die electrically connected to a portion of a leadframe;
    mold compound contacting portions of the semiconductor die, and the portion of the leadframe; and
    an ink residue including solder covering exposed outer ends of the portion of the leadframe providing mounting pads for the semiconductor package, wherein the ink residue includes a rectangular shape from a cross sectional view of the semiconductor package.

13. The semiconductor package according to claim 12, wherein a height of the ink residue is more than a thickness of the portion of the lead frame from a cross sectional view of the semiconductor package.

14. The semiconductor package according to claim 12, wherein the semiconductor package is a quad flat no leads (QFN) package.

15. The semiconductor package according to claim 12, wherein the ink residue is deposited using a printing process selected from the group consisting of inkjet, screen, stencil and photonic printing.

16. The semiconductor package according to claim 12, wherein the ink residue comprises silver.

17. The semiconductor package according to claim 12, wherein a first surface of the ink residue is coplanar with a surface of the mold compound.

18. The semiconductor package according to claim 12, wherein a second surface of the ink residue is coplanar with a surface of the portion of the leadframe.

* * * * *